United States Patent [19]
Ko

[11] Patent Number: 4,532,697
[45] Date of Patent: Aug. 6, 1985

[54] SILICON GIGABIT METAL-OXIDE-SEMICONDUCTOR DEVICE PROCESSING

[75] Inventor: Ping K. Ko, Ocean, N.J.

[73] Assignee: AT&T Bell Laboratories, Murray Hill, N.J.

[21] Appl. No.: 557,638

[22] Filed: Dec. 2, 1983

[51] Int. Cl.³ .................. H01L 21/225; H01L 21/425
[52] U.S. Cl. ................................. 29/571; 29/576 W; 29/576 B; 148/1.5; 148/187; 148/188
[58] Field of Search ............................ 29/571, 576 W; 357/23 S, 23 CS, 56, 59; 148/1 S, 187, 188

[56] References Cited

U.S. PATENT DOCUMENTS

| | | | |
|---|---|---|---|
| 3,600,235 | 8/1971 | Okumura | 29/571 |
| 4,181,537 | 1/1980 | Ichinohe | 357/59 |
| 4,352,238 | 10/1982 | Shimbo | 357/56 |
| 4,356,622 | 11/1982 | Widmann | 148/188 |
| 4,417,385 | 11/1983 | Temple | 29/571 |

OTHER PUBLICATIONS

Hewlett-Packard Journal (1982), "MQMOS: A High-Performance NMOS Technology" by H. Fu et al., pp. 21-27.

J. Electrochem. Soc., 1978, "Thermal Oxidation of Phosphorus-Doped Polycrystalline Silicon in Wet Oxygen" by H. Sunami, pp. 892-897.

J. Electrochem. Soc., 1979, "Oxidation of Phosphorus-Doped Low Pressure and Atmospheric Pressure CVD Polycrystalline-Silicon Films" by T. I. Kamins, pp. 838-844.

Primary Examiner—Brian E. Hearn
Assistant Examiner—Hunter L. Auyang
Attorney, Agent, or Firm—Gregory C. Ranieri

[57] ABSTRACT

In a metal-oxide-semiconductor device process, parasitic capacitance is significantly reduced by differentially oxidizing a substrate and a gate mesa thereon prior to ion implantation and "drive-in" of the drain and source regions. This results in a channel region being formed in the substrate beneath and substantially coextensive with the gate mesa. The conductivity of the channel region is different from the conductivity of the adjacent source and drain regions. In one embodiment, the source and drain regions each extend to a greater depth into the substrate with increasing distance from the channel region.

9 Claims, 3 Drawing Figures

SILICON GIGABIT METAL-OXIDE-SEMICONDUCTOR DEVICE PROCESSING

TECHNICAL FIELD

The present invention relates to silicon technology and, more particularly, to devices fabricated by metal-oxide-semiconductor techniques.

BACKGROUND OF THE INVENTION

Conventional scaled metal-oxide-semiconductor (MOS) technology has been designed for the implementation of complex large scale integrated circuits containing both analog and digital functional elements. These circuits are generally capable of moderately high speed operation. Operation in the range of gigabits per second is impaired for these circuits because of parasitic capacitances which arise as a result of the fabrication process.

An important parasitic capacitance, in this regard, is the capacitance caused by the gate overlap over the source and the drain regions in the substrate. This overlap is illustrated in FIG. 6 of a technical article by H. Fu et al., *Hewlett-Packard Journal*, pp. 21-7 (1982). Typically, the overlap capacitance is on the order of 0.5 fF/$\mu$m.

Another important parasitic capacitance which limits operating speeds for these MOS circuits is the junction capacitance between the regions of different conductivity, i.e., between source (drain) and substrate and between source (drain) and channel.

SUMMARY OF THE INVENTION

Parasitic capacitances are significantly reduced in accordance with the principles of the invention by differentially oxidizing a substrate and a gate mesa thereon prior to ion implantation and "drive-in" of the drain and source regions. This results in a channel region being formed in the substrate beneath and substantially coextensive with the gate mesa. The conductivity of the channel region is different from the conductivity of the adjacent source and drain regions.

According to another aspect of the invention, other parasitic capacitances are significantly reduced by differentially oxidizing the substrate and a source layer, a drain layer and a gate mesa thereon prior to ion implantation and "drive-in" of the source and drain regions. The source and drain layers and the gate mesa are heavily doped to an opposite conductivity type from that of the substrate. This results in the channel region being formed in the substrate beneath and substantially coextensive with the gate mesa. Furthermore, source and drain regions are formed beneath the respective source and drain layers and extending up to the channel region. In one embodiment, the source and drain regions each extend to a greater depth into the substrate with increasing distance from the channel region.

BRIEF DESCRIPTION OF THE DRAWING

A more complete understanding of the invention may be obtained by reading the following description of a specific illustrative embodiment of the invention in conjunction with the appended drawing in which.

DETAILED DESCRIPTION

Figure 1:
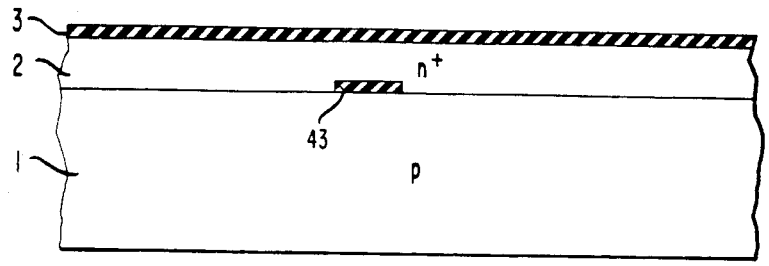
FIGS. 1 through 3 show an exemplary substrate and polycrystalline silicon layer at various stages of the metal-oxide-semiconductor device fabrication process in accordance with aspects of the present invention.

FIG. 1 shows an exemplary substrate 1 having a semiconductor layer 2 grown or deposited thereon. In general, substrate 1 has been processed by a conventional scaled MOS technology well known to those skilled in the art. This previous processing includes defining active device areas, ion implantation to change thresholds for enhancement or depletion device operation and the like. See, for example, a text by E. H. Nicollian et al. entitled "MOS (Metal Oxide Semiconductor) Physics and Technology" (J. Wiley & Sons, Inc. 1982) or the aforementioned article by Fu et al.

Substrate 1 is comprised of a doped semiconductor material such as p-type silicon whose doping concentration decreases with distance from the junction with layer 2. An exemplary variation in doping concentration for a 200 to 300 $\mu$m thick substrate 1 is from $3.0 \times 10^{16}/cm^3$ near layer 2 to $1.0 \times 10^{15}/cm^3$ within several microns of layer 2.

Layer 2, in an exemplary embodiment, is comprised of polycrystalline silicon. The conductivity of layer 2 is opposite to the conductivity of substrate 1. Typically, layer 2 is heavily doped to n-type conductivity with phosphorus, boron or arsenic to a concentration of $1.0 \times 10^{20}/cm^3$ over a thickness of approximately 0.5 $\mu$m.

Layer 3 is an optional layer of silicon nitride ($Si_3N_4$) which is used to protect the top of the source and drain layers (FIGS. 2, 21 and 23) and the gate mesa (FIGS. 2, 22) from oxide growth during differential oxidization.

Standard photolithographic masking and etching techniques are employed to define source layer 21, gate mesa 22, and drain layer 23. Only gate mesa 22 is insulated from substrate 1 by a thin ($\sim$200 Angstroms) insulator or oxide (e.g., $SiO_2$) layer 43. Layers 31, 32 and 33 result from the photolithographic processing of layer 3 (FIG. 1). Photolithographic processing also exposes substrate surfaces 14 and 15.

Figure 2:
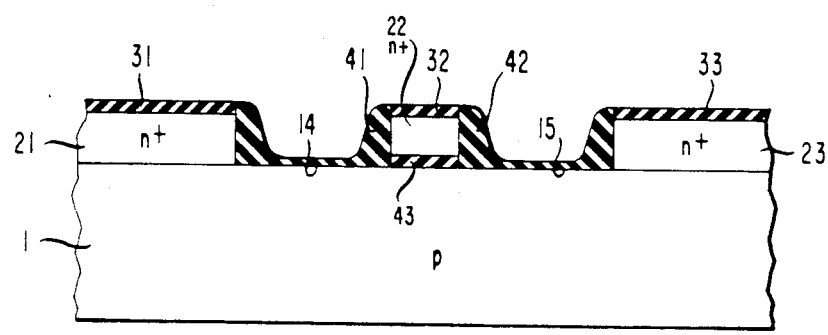

There exists a sharp difference in doping concentrations between substrate 1 (exposed substrate surface 14 and 15) and layers 21, 22 and 23. This difference is quite apparent when traversing the perimeter of the wells formed by the sides of gate mesa 22 and source layer 21 and substrate surface 14 (source-gate well) and by the sides of gate mesa 22 and drain layer 23 and substrate surface 15 (drain-gate well). By judicious use of this difference, it is possible to grow a wet oxide at low temperature in the wells as shown in FIG. 2. When oxide growth is complete, oxide layer 41 occupies the source-gate well and oxide layer 42 occupies the drain-gate well. The doping concentration difference causes the oxide layers 41 and 42 to be thicker on the sides of the source/gate/drain layers than on the exposed substrate surfaces. In an example from experimental practice, the sidewalls of oxide layers 41 and 42 are three times thicker than the bottom, i.e., 0.15 $\mu$m versus 0.05 $\mu$m. The step of forming an oxide in this manner is known as differential oxidization. Examples of this type of oxidization are given in the following articles: H. Sunami, *J. Electrochem. Soc.*, pp. 892-7 (1978) and T. Kamins, *J. Electrochem. Soc.*, pp. 838-844 (1979).

Ion implantation is then performed into substrate surfaces 14 and 15. Exemplary dopant ions are selected from the group consisting of phosphorus, boron and arsenic. The thick sides of oxide layers 41 and 42 inhibit implantation of dopant ions near to the sides of gate mesa 22. In one sense, the thick sides can be viewed as spacers to keep the implanted ions for the source and drain regions away from the gate mesa 22. In turn, this reduces the capacitance of the gate-drain/source overlap because the overlap resulting from diffusion during "drive-in" is negligible.

Drive-in is a thermal process whereby the source, gate and drain layers and the substrate are heated to a high temperature (~500-1200 degrees Centigrade) for a sufficient time to permit diffusion of the implanted dopant ions into substrate 1. The MOS structure resulting after is shown in FIG. 3.

Figure 3:
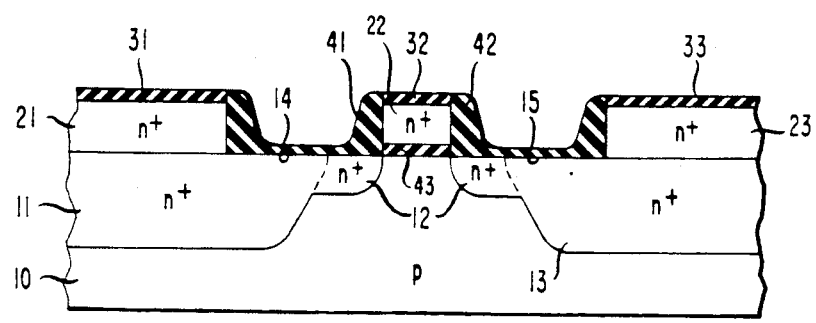

As shown in FIG. 3, there is a deep diffusion (~0.5-0.6 μm) of the dopants from source layer 21 into the substrate to form deep source region 11. Similarly, the implanted ions through substrate surface 14 diffuse shallowly (~0.1-0.3 μm) to form shallow source region 12. Deep source region 11 and shallow source region 12 form the entire source region. A similar process occurs on the drain side and deep drain region 13 and shallow drain region 12 combine to form the entire drain region. The deep diffusion is caused by using phosphorus ions to dope layers 21 and 23; the shallow diffusion is caused by implanting arsenic ions into substrate surfaces 14 and 15. This type of deep/shallow diffusion is advantageous for reducing the parasitic capacitance between the source (drain) region and the p-substrate 10. The shallow diffusion produces a relatively short, high capacitance junction whereas the deep diffusion produces a relatively long, low capacitance junction with the lower-doped portion of substrate 10.

A channel region defined between n+-type regions is substantially beneath and coextensive with gate mesa 22. Because of the adjacent shallow source (drain) regions 12, the channel region is electronically controlled almost entirely by gate mesa 22 and the possibility of punch-through is substantially eliminated.

In an example from experimental practice, the channel length measured between regions 12 is in the range 0.5 μm to 1.0 μm. Also, exemplary doping concentrations for the deep regions 11 (13) gradually varies from $1.0 \times 10^{20}/cm^3$ near the source layer 21 (drain layer 23) to $10^{15}/cm^3$ or $10^{16}/cm^3$ near the lower junction with p-substrate 10. The shallow region 12 exhibits a similar range of variation.

While it has been shown that a deep/shallow diffusion reduces parasitic capacitance, it is contemplated that a deep/deep diffusion or a shallow/shallow diffusion could be used with a degradation because of increased parasitics. These latter diffusions result from using similar dopant ions in layer 21 and 23, in the implant step, through substrate surfaces 14 and 15.

Moreover, it will be obvious to those skilled in the art that the silicon nitride layer 3 is not necessary to protect the tops of layers 21 through 23. Ion milling or reactive ion etching can be used to remove oxide deposited or grown on top of layers 21 through 23. Also, in this regard, if ion milling or reactive ion etching is employed, the oxide may be deposited by chemical vapor deposition or the like, for example, rather than grown.

It should also be apparent to those skilled in the art that the teachings contained herein are applicable to all variations of MOS device processing technology. It should be equally clear that, for some MOS device processing techniques, it is necessary to change the conductivity types from those show in the Figures and described above, i.e., change p-type to n-type and n-type to p-type.

What is claimed is:

1. A method of forming a channel region in a semiconductor substrate of first type conductivity, the substrate having a mesa of semiconductor material thereon and a layer of insulator material interposed between the mesa and the substrate, the method being characterized by the steps of
    differentially oxidizing the mesa and substrate to cause an insulator material layer to grow thicker on the sides of the mesa than on the exposed surface of the substrate,
    implanting dopant ions into at least the exposed surface of the substrate to cause a region of second type conductivity to be formed therein, and
    heating the mesa and substrate to diffuse the dopant ions into the substrate thereby defining the channel region in the substrate between the regions of second type conductivity, the channel region being substantially coextensive with the mesa.

2. The method as defined in claim 1 being further characterized in that the dopant ions are selected from the group consisting of arsenic, boron, and phosphorus.

3. The method as defined in claim 1 being further characterized in that the mesa is doped to be second type conductivity.

4. The method as defined in claim 3 being further characterized in that the mesa is doped with ions selected from the group consisting of phosphorus, boron and arsenic.

5. A method of forming source, channel and drain regions in a semiconductor substrate of first type conductivity, the substrate having source and drain layers thereon, the substrate also having a gate mesa thereon interposed between and separated from the source and drain layers having a layer of insulator material interposed between the gate mesa and the substrate, the source and drain layers and the gate mesa being comprised of a semiconductor material, the method being characterized by the steps
    differentially oxidizing the source and drain layers, the gate mesa, and the substrate to cause an insulator material layer to grow thicker on the sides of the gate mesa than on exposed surfaces of the substrate,
    implanting first dopant ions of second conductivity type into at least the exposed surfaces of the substrate, the source and drain layers and the gate mesa including second dopant ions of second type conductivity type therein, and
    heating the layers, the mesa and the substrate to diffuse first and second dopant ions into the substrate thereby forming source, channel and drain regions in the substrate, the channel region being between source and drain regions of second type conductivity, the channel region being substantially coextensive with the gate mesa.

6. The method as defined in claim 5 further characterized in that source and drain regions formed by the second dopant ions extend farther into the substrate than corresponding regions formed by the first dopant ions.

7. The method as defined in claim 5 further characterized in that the first dopant ions are selected from the group consisting of arsenic, phosphorus and boron.

8. The method as defined in claim 5 further characterized in that the second dopant ions are selected from the group consisting of phosphorus, arsenic and boron.

9. The method as defined in claim 5 further characterized in that source and drain regions formed by the second dopant ions extend to a substantially equal position in the substrate as corresponding regions formed by the first dopant ions.

* * * * *